United States Patent
Sheng

(10) Patent No.: US 7,908,307 B2
(45) Date of Patent: Mar. 15, 2011

(54) FILTER BANK AND METHOD FOR IMPROVING EFFICIENCY THEREOF

(75) Inventor: Se-Hao Sheng, Taipei County (TW)

(73) Assignee: Via Technologies, Inc., Hsin-Tien, Taipei (TW)

( * ) Notice: Subject to any disclaimer, the term of this patent is extended or adjusted under 35 U.S.C. 154(b) by 910 days.

(21) Appl. No.: 11/778,230

(22) Filed: Jul. 16, 2007

(65) Prior Publication Data

US 2008/0091760 A1     Apr. 17, 2008

(51) Int. Cl.
    *G06F 17/10* (2006.01)
(52) U.S. Cl. .................................................... 708/303
(58) Field of Classification Search ........... 708/300–323
    See application file for complete search history.

(56) References Cited

U.S. PATENT DOCUMENTS 5,506,798 A * 4/1996 Shimada et al. .............. 708/315
6,940,897 B2 * 9/2005 Shaikh .......................... 375/232

* cited by examiner

*Primary Examiner* — Tan V Mai

(74) *Attorney, Agent, or Firm* — Thomas Kayden

(57) ABSTRACT

The invention provides a method for improving efficiency of a filter bank. The filter bank includes multiple filters implemented by a firmware program. Each of the filters has a corresponding filter equation with a plurality of variables including a plurality of input samples and output samples of the corresponding filter. The variables of the filters are first stored in a specific order, wherein the variables of the same filter are stored together and the input samples and the output samples are stored separately and sorted according to a time index thereof. A starting pointer is then pointed to a first variable of a first filter of the filters. A plurality of current output samples of the filters is then generated according to the filter equations, the variables stored in the specific order, and a plurality of current input samples of the filters. The variables of the filter equations are then updated with the current input samples and the current output samples according to the specific order. Finally, the starting pointer is moved to a next variable of the first variable along a variable update direction for identifying the variables corresponding to a plurality of next samples of the filters.

18 Claims, 8 Drawing Sheets

FILTER BANK AND METHOD FOR IMPROVING EFFICIENCY THEREOF

BACKGROUND OF THE INVENTION

1. Field of the Invention

The invention relates to filter banks, and more particularly to filter bank which is implemented by a firmware program.

2. Description of the Related Art

A filter bank is made up of a plurality of filters. Because the filtration bandwidth of an individual filter is low, a signal with higher frequency bandwidth is often filtered via a filter bank comprising a plurality of filters, each filtering a frequency range with a lower bandwidth. Thus, in more complex signal processing systems signals are frequently filtered via a filter bank. For example, a conventional equalizer comprises a filter bank including several tens of filters for processing signals.

FIG. 1 is a flowchart of a conventional method 100 for operating a filter bank. The filter bank includes K filters. In step 102, a sample of an input signal is filtered by the first filter of the filter bank, and is then sequentially filtered by a second filter to a K-th filter of the filter bank in steps 102 to 10k. If the filter bank needs to filter a next sample of the input signal in step 110, the next sample is delivered to the first filter for filtration in step 102, otherwise, method 100 ends.

Ordinary filters are implemented with hardware circuits. Software programs handle digital signals with lower complexity and thus, are more convenient. A variety of current digital signal filters have been implemented with software or firmware programs. The filtration process of a firmware filter can be expressed as equation (1). A filtered output sample $Y_0^k$ is expressed as output of equation (1) with input variables of a current input sample $X_0^k$, a series of previous input samples $X_i^k$ previous to the current input sample, and a series of previous output samples $Y_j^k$ corresponding to the previous input samples, wherein k is a filter index, and i and j are sample sequences of input samples and output samples numbered from the current input sample and greater than 0. The filter equation is shown below:

$$Y_0^k = (a_0^k \times X_0^k + a_1^k \times X_1^k + \ldots + a_M^k \times X_M^k) + (b_1^k \times Y_1^k + b_2^k \times Y_2^k + \ldots + b_N^k \times Y_N^k); \quad (1)$$

wherein $a_M^k$ is a parameter of the M-th previous input sample, and $b_N^k$ is a parameter of the N-th previous output sample. If M is equal to N, both M and N can be presented as the order of the filter equation.

FIG. 2 is a flowchart of a conventional method 200 for filtering samples with a firmware filter executed by a processor. First, a current output sample $Y_0^k$ is generated in step 202 according to the filter equation (1) with the input variables of a current input sample $X_0^k$, a series of previous input samples $X_i^k$, and a series of previous output samples $Y_j^k$. The variables of the filter equation must be updated previous to the generation of each output sample. For example, a current input sample $X_0^k$ will become a previous input sample $X_1^k$ for generating the next output sample, and a current output sample $Y_0^k$ will become a previous output sample $Y_1^k$ for generating the next output sample. Thus, the input variables of the filter equation (1) are updated with the current input sample and the current output sample in step 204. For example, the input variables of the filter equation (1), including input samples $X_1^k \sim X_M^k$ and output samples $Y_1^k \sim Y_N^k$ for generating the previous output sample $Y_1^k$, are updated with input samples $X_0^k \sim X_{M-1}^k$ and output samples $Y_0^k \sim Y_{N-1}^k$ for generating the current output sample $Y_0^k$. Thus, (M+N) input variables are updated in step 204. If a next input sample is not yet processed by the filter equation in step 210, the next input sample is filtered according to the filter equation in step 206, otherwise, the method 200 ends.

The steps 102~10k of method 100 in FIG. 1 can be implemented according to the steps 202 and 204 of method 200 of FIG. 2. Because (M+N) input variables must be updated in step 204, processor resources are squandered on updating the input variables. When a filter bank filters a signal with k filters, a sample of the signal requires the input variable to be updated K×(M+N) times. Thus, the time required to update input variables of filter equations is increased with an increase in the orders of the filter equations and the number of filters included in a filter bank. According to empirical experimental statistics, a filter bank exhausts one third of the total signal filtration time on updating variables of filter equations in the filters. Thus, the great amount of time spent updating variables of filter equations severely affects filter bank performance.

BRIEF SUMMARY OF THE INVENTION

The invention provides a method for improving the efficiency of a filter bank. In an exemplary embodiment of the invention, the filter bank comprises a plurality of filters. A firmware program is implemented in each of the plurality of filters, and each of the filters comprises a corresponding filter equation with a plurality of variables including a plurality of input samples and output samples of the corresponding filter. The variables of the filters are first stored in a specific order, wherein the variables of the same filter are stored together and the input samples and the output samples are stored separately and sorted according to a time index thereof. A starting pointer is then pointed to a first variable of a first filter of the filters. A plurality of current output samples of the filters are then generated according to the filter equations, the variables stored in the specific order, and a plurality of current input samples of the filters. The variables of the filter equations are then updated with the current input samples and the current output samples according to the specific order. Finally, the starting pointer is moved to a next variable of the first variable along a variable update direction for identifying the variables corresponding to a plurality of next samples of the filters.

The invention also provides a filter bank. The filter bank comprises a plurality of filters. A firmware program is implemented in each of the plurality of filters, and each of the filters comprises a corresponding filter equation with a plurality of variables including a plurality of input samples and output samples of the corresponding filter. In an exemplary embodiment, the filter bank comprises a first memory device and a processor. The first memory device stores the variables of the filters in a specific order. The variables of the same filter are stored together and the input samples and the output samples are stored separately and sorted according to a time index thereof. The processor executes the firmware program, points to a first variable of a first filter of the filters with a starting pointer, generates a plurality of current output samples of the filters according to the filter equations, the variables stored in the specific order, and a plurality of current input samples of the filters, updates the variables of the filter equations with the current input samples and the current output samples according to the specific order, and moves the starting pointer to a next variable of the first variable along a variable update direction for identifying the variables corresponding to a plurality of next samples of the filters.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
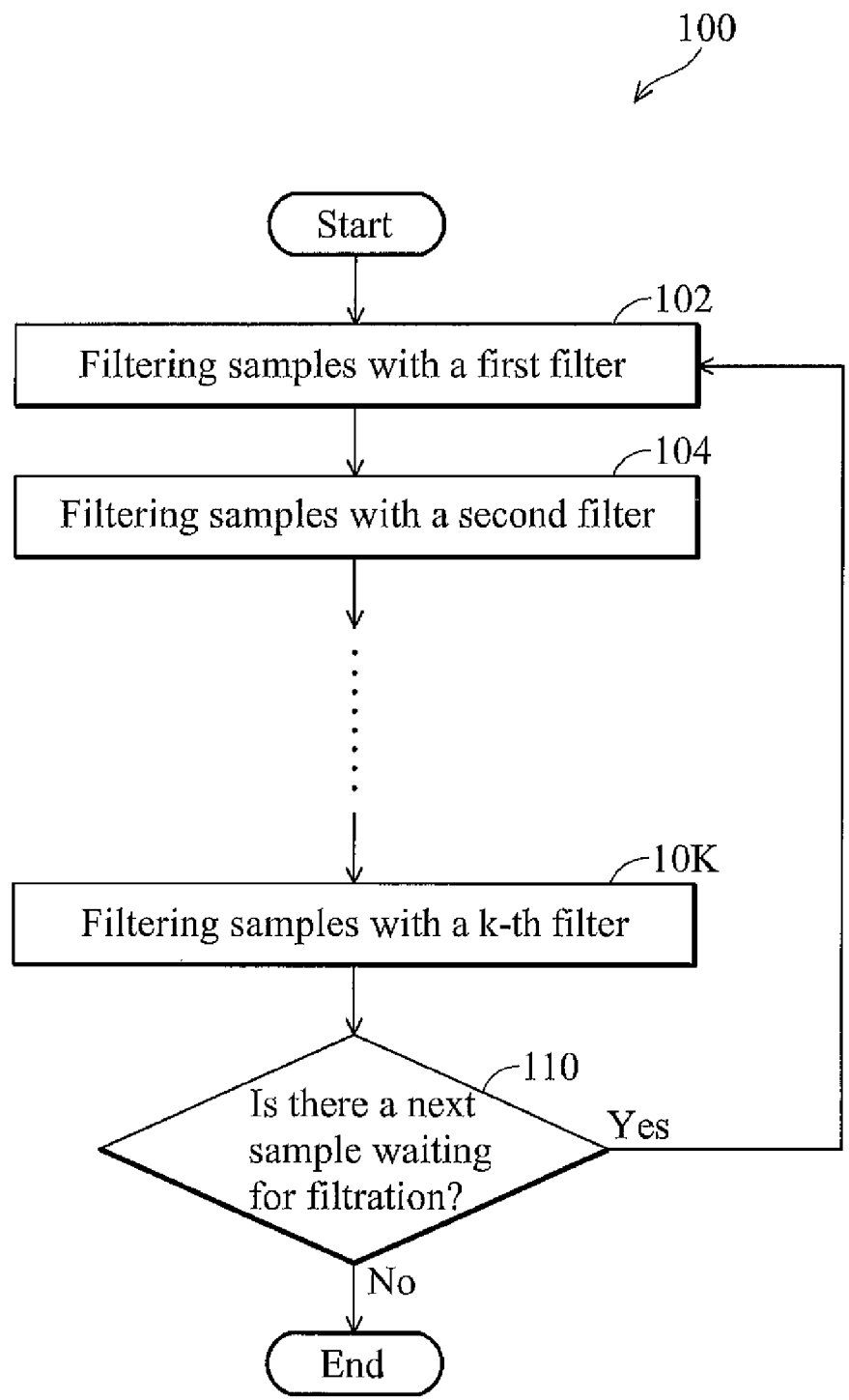
FIG. 1 is a flowchart of a conventional method for operating a filter bank.
Figure 2:
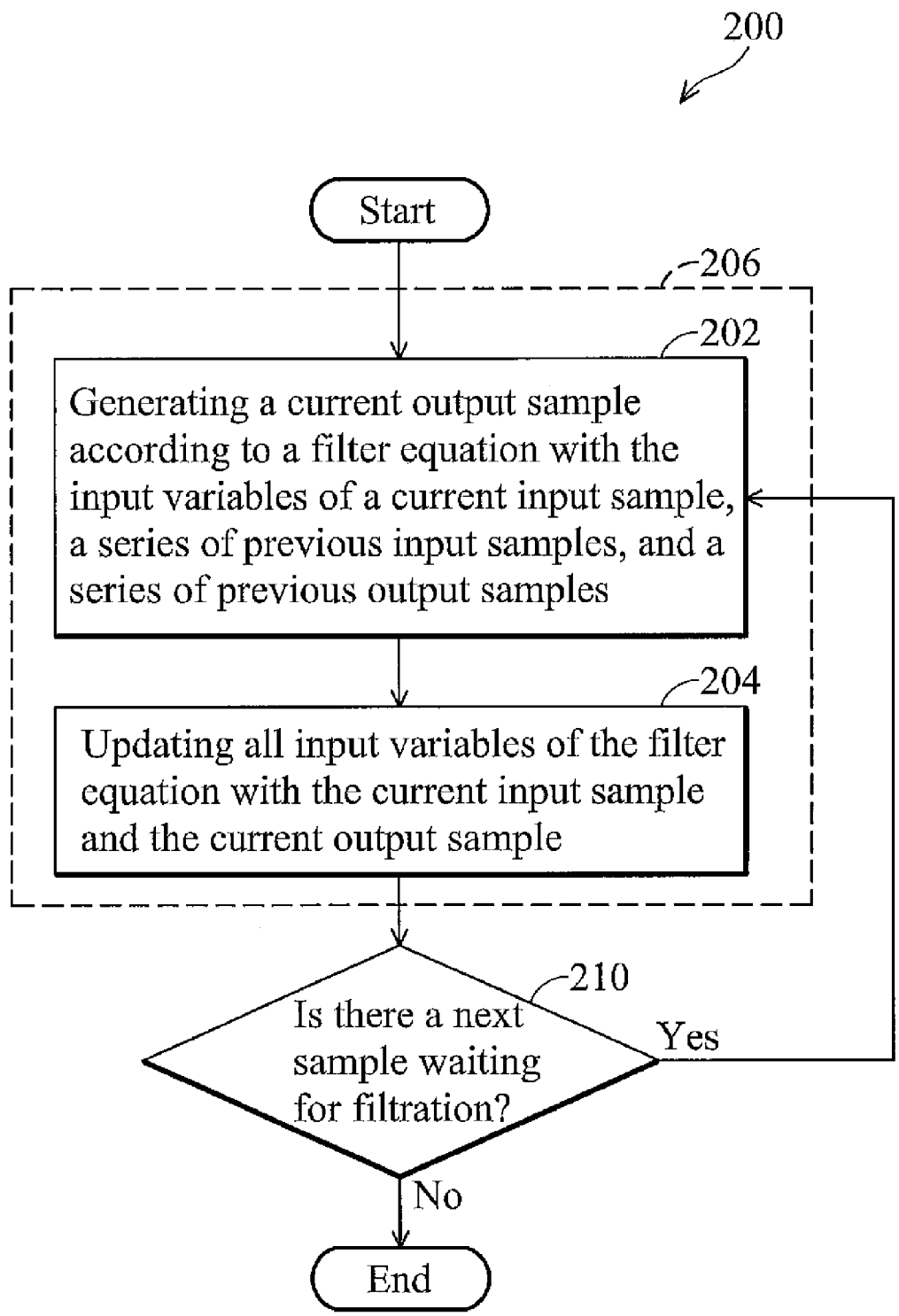
FIG. 2 is a flowchart of a conventional method for filtering samples with a firmware filter.
Figure 3:
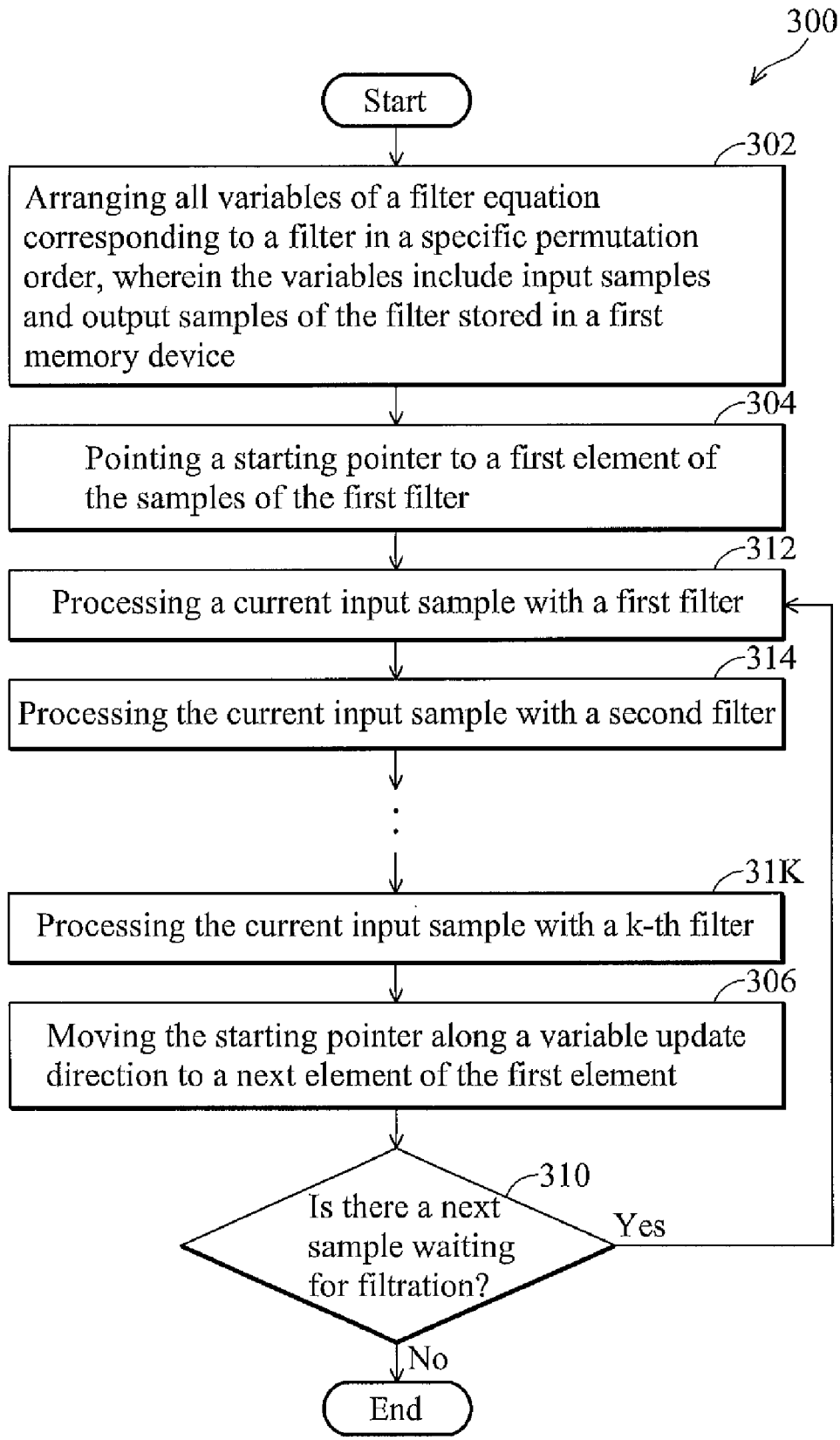
FIG. 3 is a flowchart of a method for operating a filter bank according to the invention.

FIG. 3 is a flowchart of a method 300 for operating a filter bank according to the invention. The filter bank comprises K filters, and the samples delivered to the K filters are processed according to K equations. The K filters are implemented in practice by firmware executed by a processor. Each of the K equations is in the form of equation (1) and respectively corresponds to one of the K filters. To reduce the excessive variable updating of method 200, a first memory device arranges the variables of the equations corresponding to the K filters in a specific order in step 302 of method 300. The variables include previous input samples $X_1^k$ and previous output samples $Y_j^k$.

Figure 4:
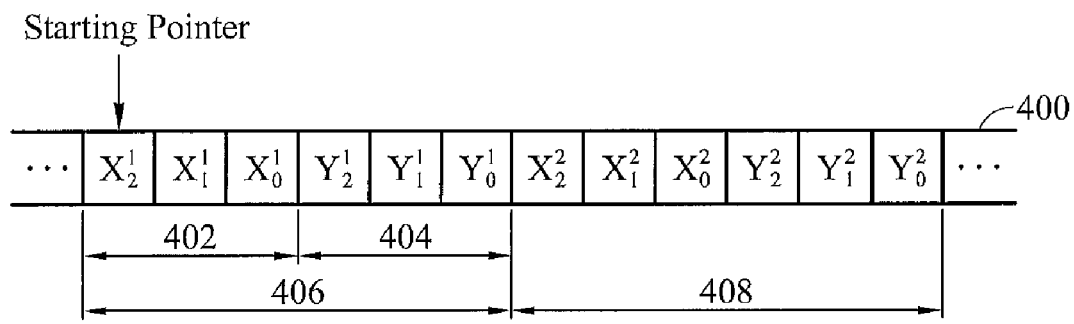
FIG. 4 shows an embodiment of a specific order for arranging variables of a filter bank according to the invention.

FIG. 4 shows an embodiment of a specific order for arranging variables of a filter bank according to the invention. The variables of all equations of the filter bank are stored in a first memory device 400 in the specific order. FIG. 4 is illustrated with a second order equation (2) in the following, wherein the equation (2) is simplied from equation (1):

$$Y_0^k = (a_0^k \times X_0^k + a_1^k \times X_1^k + a_2^k \times X_2^k) + (b_1^k \times Y_1^k + b_2^k \times Y_2^k) \qquad (2)$$

The parameter k is an index of specific filters of the filter bank. The samples $X_i^k$ and $Y_j^k$ corresponding to a specific filter of index k are stored together. For example, the samples $X_i^1$ and $Y_j^1$ of a first filter are stored in a region 406, and the samples $X_i^2$ and $Y_j^2$ of a second filter are stored in a region 408. The input samples $X_i^k$ and output samples $Y_i^k$ of each specific filter are respectively stored together in a time order.

For example, the input samples $X_i^1$ and output samples $Y_j^1$ of the first filter are respectively stored in the regions 402 and 404, wherein the input samples $X_2^1$, $X_1^1$, and $X_0^1$ are arranged in a time order, and the output samples $Y_2^1$, $Y_1^1$, and $Y_0^1$ are also arranged in a time order. A starting pointer points to a first element $X_2^1$ of the samples corresponding to the first filter in step 304 of method 300. In one embodiment, the first memory device 400 is a circular buffer, thus, when there is no space for the storage of a current input sample $X_0^k$ or a current output sample $Y_0^k$ in the first memory device 400, the current input sample $X_0^k$ or the current output sample $Y_0^k$ can be directly stored in a starting end of the first memory device 400.

Figure 5:
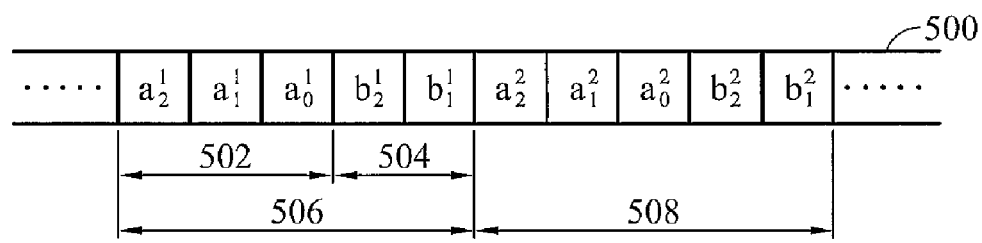
FIG. 5 shows an embodiment of a specific order for arranging parameters of a filter bank according to the invention.

FIG. 5 shows an embodiment of a specific order for arranging parameters of a filter bank according to the invention. The parameters of all equations of the filter bank are stored in a second memory device 500 in the specific order. FIG. 5 is also illustrated with the equation (2). The parameters of the equation (2) are all arranged in the same order as the variables of FIG. 4. The parameters $b_i^1$ and $a_j^1$ of the equation corresponding to a first filter are stored in a region 506, and the parameters $b_i^2$ and $a_j^2$ of the equation corresponding to a second filter are stored in a region 508. The parameters $a_j^1$ and $b_i^1$ of input samples $X_i^k$ and output samples $Y_i^k$ of the first filter are respectively stored in regions 502 and 504, wherein the parameters $a_2^1$, $a_1^1$, and $a_0^1$ of the input samples are arranged in a time order, and the parameters $b_2^1$ and $b_1^1$ of the output samples are also arranged in a time order.

Figure 6A:
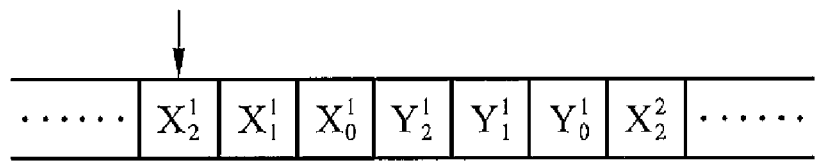
FIGS. 6a to 6d show an update process of the variables stored in the specific order of FIG. 4 according to the invention.

The samples are then processed sequently by the first filter to the k-th filter in steps 312 to 31k according to method 300. Because the variables of all equations of the filter bank are arranged in the order in the first memory device 400 in step 302, a firmware needs not waste time updating variables of the equations. The sample processing process in each filter of steps 312 to 31k are similar and can be illustrated with an example of the first filter. FIG. 6a shows variables $X_2^1$, $X_1^1$, $X_0^1$, $Y_2^1$, $Y_1^1$, $Y_0^1$ of the first filter stored in a first memory device and arranged in the order of FIG. 4. The starting pointer points to $X_2^1$ in the beginning.

Figure 6B:
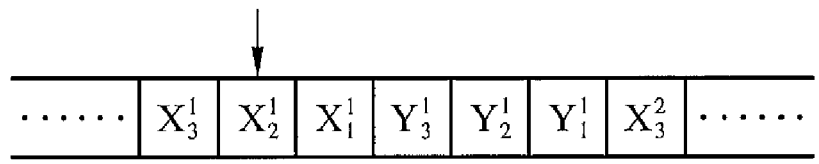

If the samples have been processed by all k filters, the index of the variables must be changed. For example, a current input sample $X_0^1$ corresponding to a previous processing stage becomes a previous input sample $X_1^1$ corresponding to a current processing stage. Similarly, the variables $X_2^1$, $X_1^1$, $X_0^1$, $Y_2^1$, $Y_1^1$, $Y_0^1$ of the previous processing stage become the variables $X_3^1$, $X_2^1$, $X_1^1$, $Y_3^1$, $Y_2^1$, $Y_1^1$ of the current processing stage. Because the starting pointer must point to a first element of a first filter, and the first element $X_3^1$ of the previous processing stage becomes useless in the current processing stage, the update of indexes of variables can be achieved by directly moving the starting pointer to the next element $X_2^1$ of the first element $X_3^1$ of the previous processing stage as shown in FIG. 6b. Therefore, rearrangement for variables is not required.

Figure 6C:
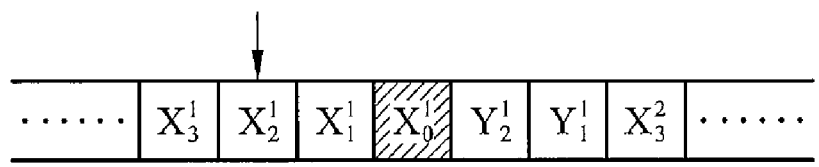
Figure 6D:
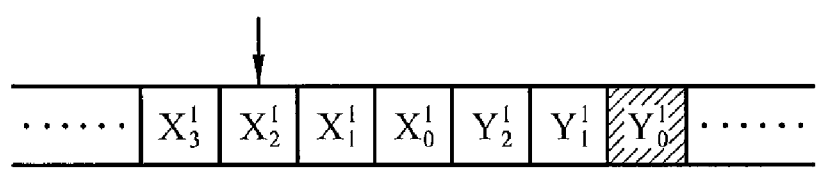

The first filter then replaces an earliest output sample $Y_3^1$ with a recently received input sample $X_0^1$ to update the input samples thereof. FIG. 6c shows the samples of the first filter stored in the first memory device after a current input sample $X_0^1$ is updated. A processor can then sequentially read the first memory device to obtain the variables $X_2^1$, $X_1^1$, $X_0^1$, $Y_2^1$, $Y_1^1$ of the equation (2) corresponding to the first filter, and sequentially read the second memory device to obtain the parameters $a_2^1$, $a_1^1$, $a_0^1$, $b_2^1$, $b_1^1$ of the equation (2) corresponding to the first filter. The processor then generates a current output sample $Y_0^1$ of the first filter according to the equation (2), the variables, and the parameters corresponding to the first filter. Finally, the processor replaces the earliest input sample $X_3^2$ of the next filter with the current output sample $Y_0^1$, as shown in FIG. 6d. The sample processing of the first filter only requires two variables $X_0^1$ and $Y_0^1$ to be updated without continuously rearranging all variables, as shown in FIGS. 6c and 6d.

The second filter to the k-th filter of the filter bank can then process samples in steps 314 to 31k of method 300 according to the sample procedures as shown in FIGS. 6c and 6d. After all filters have completed sample processing, the processor moves the starting pointer along a variable update direction to a next element of the first element in step 306, as shown in FIG. 6b. Finally, the processor determines whether a next sample is waiting to be processed. If no sample requires processing, method 300 ends, otherwise method 300 returns to step 312 to process the next sample.

Figure 7:
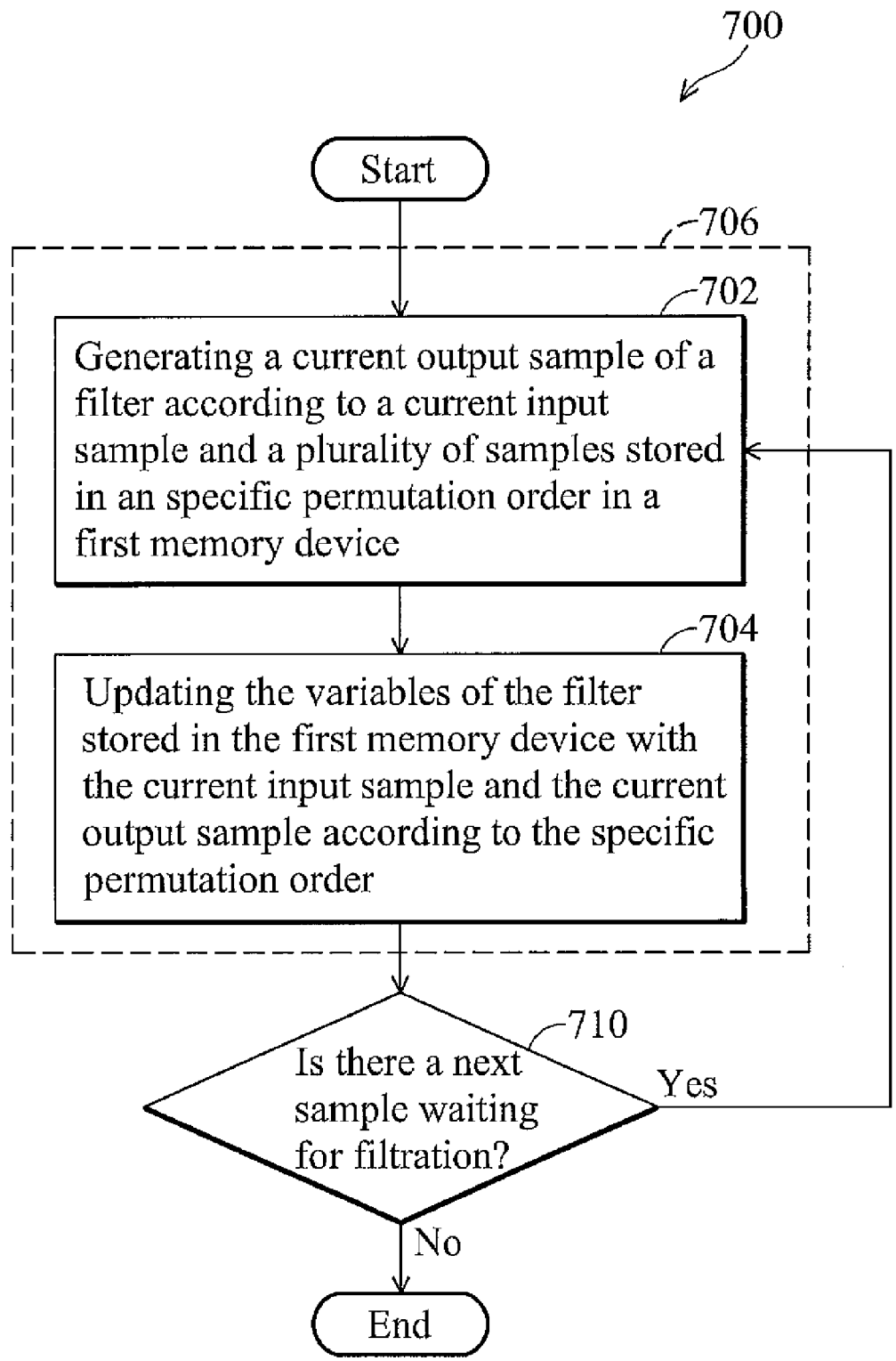
FIG. 7 shows a flowchart of a method for processing samples of a single filter according to the invention.

FIG. 7 shows a flowchart of a method 700 for processing samples of a single filter according to the invention. A processor executing a firmware implements the filter. A current output sample $Y_0^k$ of the filter is first generated according to a current input sample $X_0^k$ and a plurality of samples $X_i^k$ and $Y_j^k$ stored in a specific order in a first memory device in step 702. The variables are then updated according to the procedures shown in FIGS. 6c and 6d in step 704. The samples of the filter stored in the first memory device are replaced with the current output sample $Y_0^k$ and the current input sample $X_0^k$ according to the specific order in step 704. Thus, only two variables need to be updated in step 704, instead of the (M+N) variables updated in step 204 of a conventional method 200. If there is no next sample waiting to be processed in step 710, the method 700 ends. Each of the steps 312 to 31k of method 300 in FIG. 3 can be implemented with step 706 of FIG. 7, wherein step 706 comprises steps 702 and 704.

Figure 8A:
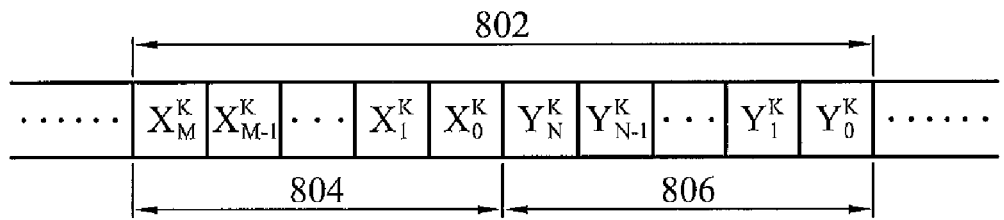
FIGS. 8a to 8d respectively show different permutation orders arranging variables of a filter bank according to the invention.

The permutations of the order for arranging the variables of filters are not limited to the specific order shown in FIG. 4. Another four order permutations are provided for reference. FIG. 8a shows a generalized permutation order for arranging variables of an equation corresponding to a k-th filter according to FIG. 4. A region 802 of a first memory device stores variables of the k-th filter, including input samples $X_M^k$, $X_{M-1}^k, \ldots, X_1^k, X_0^k$ stored in a region 804 and output samples $Y_N^k, Y_{N-1}^k, \ldots, Y_0^k$ stored in a region 806. In the situation corresponding to FIG. 6b, the variables stored in the region 804 are changed to $X_{M+1}^k, X_M^k, \ldots, X_2^k, X_1^k$, and the variables stored in region 806 are changed to $Y_{N+1}^k, Y_N^k, \ldots, Y_2^k, Y_1^k$. A starting pointer is moved along the variable update direction to a next element $X_N^k$ of the being-changed variables. In the situation corresponding to FIG. 6c, a variable $Y_{N+1}^k$ is replaced with a current input sample $X_0^k$ for updating the variable. Accordingly, in the situation corresponding to FIG. 6d, a variable $X_{M+1}^{k+1}$ corresponding to a next filter is replaced with a current output sample $Y_0^k$ for updating the variable.

Figure 8B:
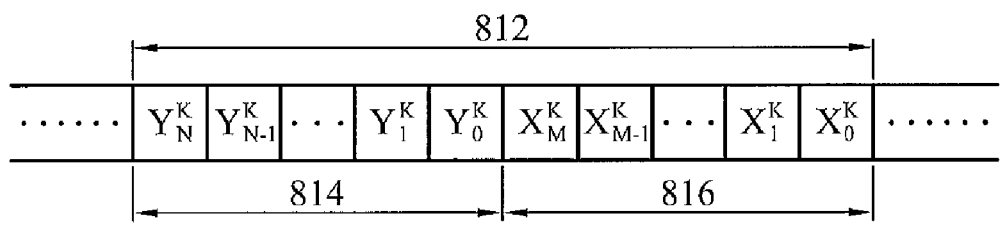

FIG. 8b shows another variable permutation order obtained by arranging the output samples in front of the input samples of FIG. 8a. A region 812 of a first memory device stores variables of the k-th filter, including output samples $Y_N^1$, $Y_{N-1}, \ldots, Y_1^k, Y_0^k$ stored in a region 814 and input samples $X_M^k, X_{M-1}^k, \ldots, X_1^k, X_0^k$ stored in a region 816. In the situation corresponding to FIG. 6b, the variables stored in the region 814 are changed to be $Y_{N+1}^k, Y_N^k, \ldots, Y_2^k, Y_1^k$, and the variables stored in region 806 are changed to be $X_{M+1}^k$, $X_M^k, \ldots, X_2^k, X_1^k$. A starting pointer is moved along the variable update direction to a next element $Y_N^k$ of the being-changed variables. In the situation corresponding to FIG. 6c, a variable $Y_{N+1}^k$ of a next filter is replaced with a current input sample $X_0^k$ for updating the variable. Accordingly, in a situation corresponding to FIG. 6d, a variable $X_{M+1}^k$ is replaced with a current output sample $Y_0^k$ for updating the variable.

Figure 8C:
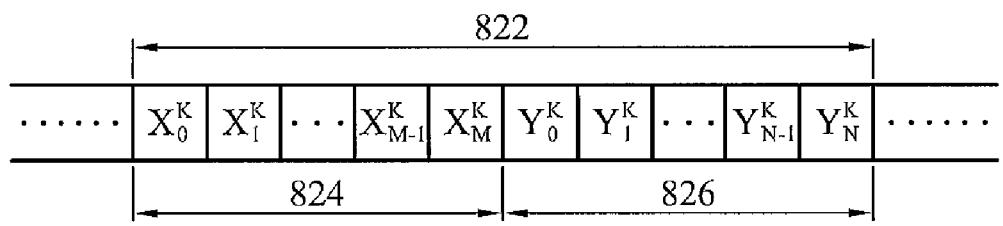

FIG. 8c shows a variable permutation order obtained by inverting elements of the output samples and the input samples of FIG. 8a. A region 822 of a first memory device stores variables of the k-th filter, including input samples $X_0^k$, $X_1^k, \ldots, X_{M-1}^k, X_M^k$ stored in a region 824 and output samples $Y_0^k, Y_1^k, \ldots, Y_{N-1}^k, Y_N^k$ stored in a region 826. In the situation corresponding to FIG. 6b, the variables stored in the region 824 are changed to be $X_1^k, X_2^k, \ldots, X_M^k, X_{M+1}^k$, and the variables stored in region 826 are changed to be $Y_1^k$, $Y_2^k, \ldots, Y_N^k, Y_{N+1}^k$. A starting pointer is moved along the variable update direction to a next element $Y_N^k$ of the being-changed variables. FIG. 6c illustrates a variable $Y_{N+1}^{k-1}$ of a previous filter replaced with a current input sample $X_0^k$ for updating the variable. Accordingly, in the situation corresponding to FIG. 6d, a variable $X_{M+1}^k$ is replaced with a current output sample $Y_0^k$ for updating the variable.

Figure 8D:
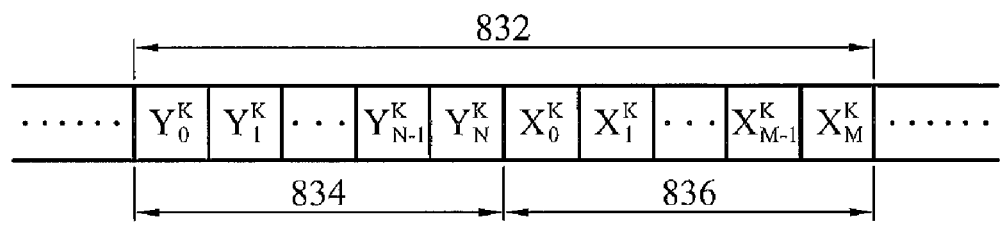

FIG. 8d shows a variable permutation order obtained by inverting elements of the output samples and the input samples of FIG. 8b. A region 832 of a first memory device stores variables of the k-th filter, including output samples $Y_0^k, Y_1^k, \ldots, Y_{N-1}^k, Y_N^k$ stored in a region 834 and input samples $X_0^k, X_1^k, \ldots, X_{M-1}^k, X_M^k$ stored in a region 836. In the situation corresponding to FIG. 6b, the variables stored in the region 834 are changed to be $Y_1^k, Y_2^k, \ldots, Y_N^k, Y_{N+1}^k$ and the variables stored in region 836 are changed to be $X_1^k$, $X_2^k, \ldots, X_M^k, X_{M+1}^k$. A starting pointer is moved along the variable update direction to a next element $X_M^k$ of the being-changed variables. In the situation corresponding to FIG. 6c, a variable $Y_{N+1}^k$ is replaced with a current input sample $X_0^k$ for updating the variable. Accordingly, in the situation corresponding to FIG. 6d, a variable $X_M^{k-1}$ of a previous filter is replaced with a current output sample $Y_0^k$ for updating the variable.

Figure 9:
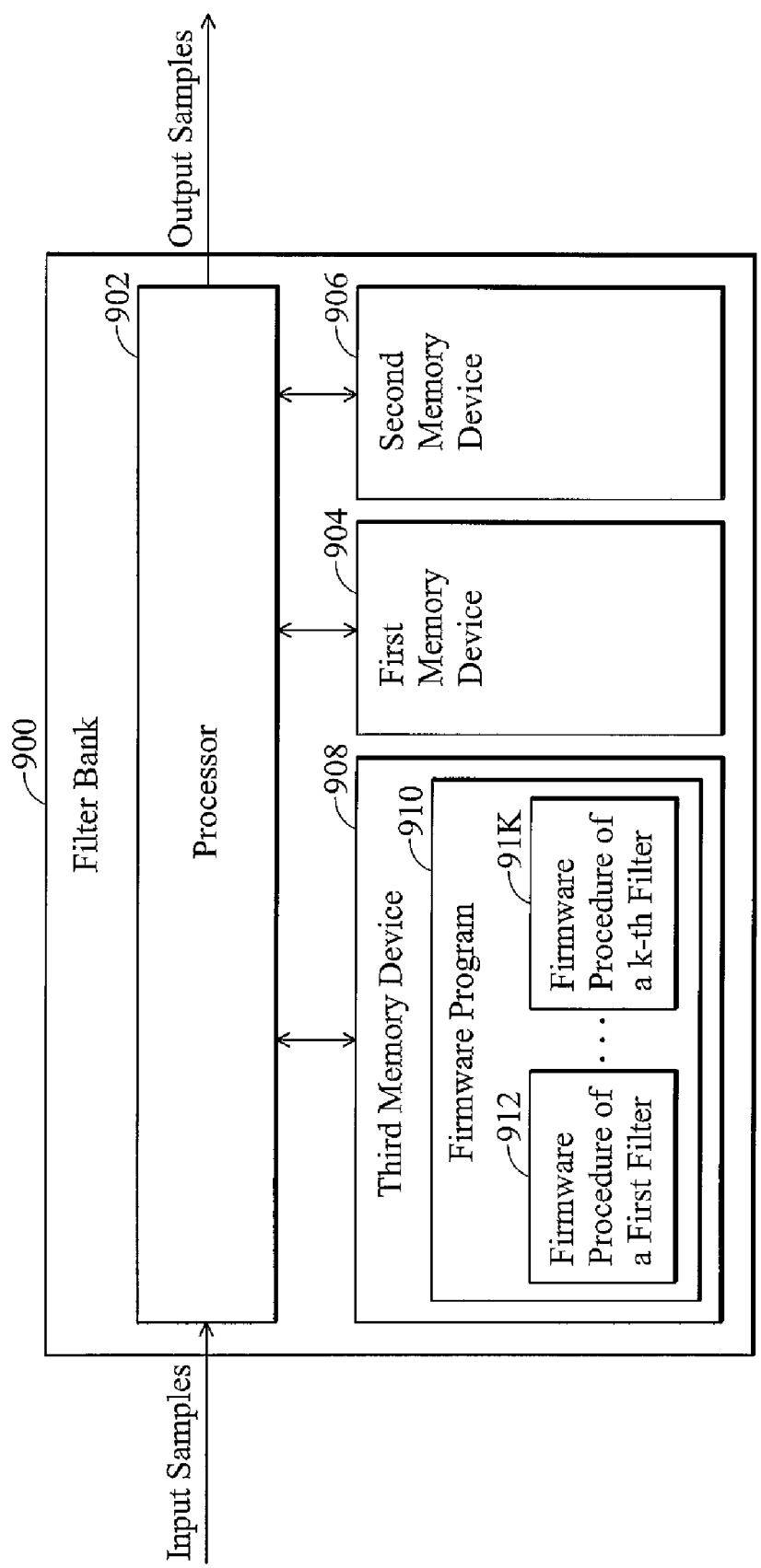
FIG. 9 is a block diagram of a filter bank according to the invention.

FIG. 9 is a block diagram of a filter bank 900 according to the invention. The filter bank 900 filters a series of input samples to generate a series of output samples. The filter bank 900 includes a processor 902, a first memory device 904, a second memory device 906, and a third memory device 908. The third memory device 908 stores a firmware program 910 comprising firmware procedures corresponding to the filters 912 to 91k. The processor 902 executes the firmware procedures 912 to 91k of the firmware program 910 to implement the filtration processes for the filters in filter bank 900. The filtration process of each of the filters of the filter bank 900 has a corresponding filtration equation, such as equation (1).

The first memory device 904 is a random access memory (RAM) or a circular buffer of the processor 902. The first memory device 904 stores multiple input samples and multiple output samples of the filters of the filter bank 900 in a specific order according to FIG. 8a, 8b, 8c, or 8d. The second memory device 906 can be a random access memory and stores a plurality of parameters of the equations corresponding to the filters in the same order as the first memory device 904, as shown in FIG. 5. The processor 902 is coupled to the first, second, and third memory devices 904, 906, and 908. When the processor 902 executes the firmware program 908, the processor 902 implements method 300 to complete operation of the filter bank 900, and implements method 700 to complete a sample filtration process for each filter in filter bank 900. Thus, updating the variables and parameters of filtration equations corresponding to the filters of the filter bank 900 of the invention can reduce the involving time of the processor.

The invention provides a method for improving performance of a filter bank. Variables of filter equations of a filter bank are stored in a specific permutation order to minimize the number of updated variables, reducing efforts for frequent variable update. According to empirical experimental statistics, the execution time of the filter bank provided by the invention is reduced by 33%, while achieving the same filtration effect as conventional filter banks. Thus, filtration efficiency of the filter bank is improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for improving efficiency of a filter bank, wherein the filter bank comprises a plurality of filters which are implemented by a firmware program executed by a processor, each of the filters has a corresponding filter equation with a plurality of variables including a plurality of input samples and output samples of the corresponding filter, and the filter bank comprises a first memory device, the method comprising:

storing in the first memory device the variables of the filters in a specific order, wherein the variables of the same filter are stored together and the input samples and the output samples are stored separately and sorted according to a time index thereof;

pointing by the processor a starting pointer to a first variable of a first filter of the filters;

generating by the processor a plurality of current output samples of the filters according to the filter equations, the variables stored in the specific order, and a plurality of current input samples of the filters;

updating by the processor the variables of the filter equations with the current input samples and the current output samples according to the specific order; and moving by the processor the starting pointer to a next variable of the first variable along a variable update direction for identifying the variables corresponding to a plurality of next samples of the filters.

2. The method as claimed in claim 1, wherein updating the variables comprises:

replacing by the processor a plurality of earliest output samples of the output samples with the current input samples; and replacing by the processor a plurality of earliest input samples of the input samples of subsequent filters with the current output samples.

3. The method as claimed in claim 1, wherein the filter bank further comprises a second memory device, and the method further comprises:

storing in the second memory decive, a plurality of parameters of the filtration equations in the specific order; and reading by the processor the parameters of the filtration equations according to the specific order for generation of the current output samples of the filters.

4. The method as claimed in claim 1, wherein the first memory device is a circular buffer, thus, the current input samples or the current output samples are automatically stored to the beginning of the circular buffer when the variables are updated by the processor if there is no additional capacity for storing the current input samples or the current output samples in the circular buffer.

5. The method as claimed in claim 1, wherein the filtration equations are expressed as the following equation:

$$Y_0^k = (a_0^k \times X_0^k + a_a^k \times X_1^k + \ldots + a_M^k \times X_M^k) + (b_1^k \times Y_1^k + b_2^k \times Y_2^k + \ldots + b_N^k \times Y_N^k);$$

wherein k indicates a filter index of the filter corresponding to the filter equation, $X_0^k$ represents a current input sample of the filter, $X_M^k$ represents an M-th input sample previous to the current input sample, $a_M^k$ represents a parameter corresponding to the M-th input sample, $Y_0^k$ represents a current output sample of the filter, $Y_N^k$ represents an N-th output sample previous to the current output sample, and $b_N^k$ represents a parameter corresponding to the N-th output sample.

6. The method as claimed in claim 5, wherein the specific order is "$\ldots Y_1^{k-1}, X_{M+1}^k, X_M^k, \ldots, X_2^k, X_1^k, Y_{N+1}^k, Y_N^k, \ldots, Y_2^k, Y_1^k, X_{M+1}^{k+1} \ldots$", the first variable pointed to by the starting pointer is $X_{M+1}^{k=1}$, updating the variables comprises replacing $Y_{N+1}^k$ with the current input sample $X_0^k$ and replacing $X_{M+1}^{k+1}$ with the current output sample $Y_0^k$, the next variable of the first variable is $X_M^{k=1}$, and the next sample is $X_{-1}^k$.

7. The method as claimed in claim 5, wherein the specific order is "$\ldots X_1^{k-1}, Y_{N+1}^k, Y_N^k, \ldots, Y_2^k, Y_1^k, X_{M+1}^k, X_M^k, \ldots, X_2^k, X_1^k, Y_{N+1}^{k+1} \ldots$", the first variable pointed to by the starting pointer is $Y_{N+1}^k$ updating the variables comprises replacing $Y_{N+1}^{k+1}$ with the current input sample $X_0^k$ and replacing $X_{M+1}^k$ with the current output sample $Y_0^k$, the next variable of the first variable is $Y_N^k$, and the next sample is $X_{-1}^k$.

8. The method as claimed in claim 5, wherein the specific order is "$\ldots Y_{N+1}^{k-1}, X_1^k, X_2^k, \ldots, X_M^k, X_{M+1}^k, Y_1^k, Y_2^k, \ldots, Y_N^k, Y_{N+1}^k, X_1^{k+1} \ldots$", the first variable pointed to by the starting pointer is $Y_{N+1}^k$, updating the variables comprises replacing $Y_{N+1}^{k-1}$ with the current input sample $X_0^k$ and replacing $X_{M+1}^k$ with the current output sample $Y_0^k$, the next variable of the first variable is $Y_N^k$, and the next sample is $X_{-1}^k$.

9. The method as claimed in claim 5, wherein the specific order is "$\ldots X_M^{k-1}, Y_1^k, Y_2^k, \ldots, Y_N^k, Y_{N+1}^k, X_1^k, X_2^k, \ldots, X_M^k, X_{M+1}^k, Y_1^{k+1} \ldots$", the first variable pointed to by the starting pointer is $X_{M+1}^k$, updating the variables comprises replacing $Y_{N+1}^k$ with the current input sample $X_0^k$ and replacing $X_M^{k-1}$ with the current output sample $Y_0^k$, the next variable of the first variable is $X_M^k$, and the next sample is $X_{-1}^k$.

10. A filter bank, comprising a plurality of filters which are implemented by a firmware program, each filter comprising a corresponding filter equation with a plurality of variables including a plurality of input samples and output samples of the corresponding filter, the filter bank comprising:

a first memory device, storing the variables of the filters in a specific order wherein the variables of the same filter are stored together and the input samples and the output samples are stored separately and sorted according to a time index thereof; and a processor, coupled to the first memory device, executing the firmware program, pointing a starting pointer to a first variable of a first filter of the filters, generating a plurality of current output samples of the filters according to the filter equations, the variables stored in the specific order, and a plurality of current input samples of the filters, updating the variables of the filter equations with the current input samples and the current output samples according to the specific order, and moving the starting pointer to a next variable of the first variable along a variable update direction for identifying the variables corresponding to a plurality of next samples of the filters.

11. The filter bank as claimed in claim 10, wherein the processor replaces a plurality of earliest output samples of the output samples with the current input samples, and replaces a plurality of earliest input samples of the input samples of subsequent filters with the current output samples, thus, the variables are updated.

12. The filter bank as claimed in claim 10, wherein the filter bank further comprises a second memory device, coupled to the processor, storing a plurality of parameters of the filtration equations in the specific order, and the processor reads the second memory device according to the specific order to obtain the parameters of the filtration equations for generation of the current output samples of the filters.

13. The filter bank as claimed in claim 10, wherein the first memory device is a circular buffer, thus, the current input samples or the current output samples are automatically stored to the beginning of the circular buffer when the processor updates the variables if there is no additional capacity for storing the current input samples or the current output samples in the circular buffer.

14. The filter bank as claimed in claim 10, wherein the filtration equations are expressed as the following equation:

$$Y_0^k = (a_0^k \times X_0^k + a_1^k \times X_1^k + \ldots + a_M^k \times X_M^k) + (b_1^k \times Y_1^k + b_2^k \times Y_2^k + \ldots + b_N^k \times Y_N^k);$$

wherein k indicates a filter index of the filter corresponding to the filter equation, $X_0^k$ represents a current input sample of the filter, $X_M^k$ represents an M-th input sample previous to the current input sample, $a_M^k$ represents a parameter corresponding to the M-th input sample, $Y_0^k$ represents a current output sample of the filter, $Y_N^k$ represents an N-th output sample previous to the current output sample, and $b_N^k$ represents a parameter corresponding to the N-th output sample.

15. The filter bank as claimed in claim 14, wherein the specific order is "... $Y_1^{k-1}$, $X_{M+1}^k$, $X_M^k$, ..., $X_2^k$, $X_1^k$, $Y_{N+1}^k$, $Y_N^k$ ..., $Y_2^k$, $Y_1^k$, $X_{M+1}^{k+1}$ ...", the first variable pointed to by the starting pointer is $X_{M+1}^k$, updating the variables comprises replacing $Y_{N+1}^k$ with the current input sample $X_0^k$ and replacing $X_{M+1}^{k+1}$ with the current output sample $Y_0^k$, the next variable of the first variable is $X_M^k$, and the next sample is $X_{-1}^k$.

16. The filter bank as claimed in claim 14, wherein the specific order is "... $X_1^{k-1}$, $Y_{N+1}^k$, $Y_N^k$, ..., $Y_2^k$, $Y_1^k$, $X_{M+1}^k$, $X_M^k$, ..., $X_2^k$, $X_1^k$, $Y_{N+1}^{k+1}$ ...", the first variable pointed to by the starting pointer is $Y_{N+1}^k$, updating the variables comprises replacing $Y_{N+1}^{k+1}$ with the current input sample $X_0^k$ and replacing $X_{M+1}^k$ with the current output sample $Y_0^k$, the next variable of the first variable is $Y_N^k$, and the next sample is $X_{-1}^k$.

17. The filter bank as claimed in claim 14, wherein the specific order is "... $Y_{N+1}^{k-1}$, $X_1^k$, $X_2^k$, ..., $X_M^k$, $X_{M+1}^k$, $Y_2^k$, ..., $Y_N^k$, $Y_{N+1}^k$, $X_1^{k+1}$ ...", the first variable pointed to by the starting pointer is $Y_{N+1}^k$, updating the variables comprises replacing $Y_{N+1}^{k-1}$ with the current input sample $X_0^k$ and replacing $X_{M+1}^k$ with the current output sample $Y_0^k$ the next variable of the first variable is $Y_N^k$, and the next sample is $X_{-1}^k$.

18. The filter bank as claimed in claim 14, wherein the specific order is "... $X_M^{k-1}$, $Y_1^k$, $Y_2^k$, ..., $Y_N^k$, $Y_{N+1}^k$, $X_1^k$, $X_2^k$, ..., $X_M^k$, $X_{M+1}^k$, $Y_1^{k+1}$ ...", the first variable pointed to by the starting pointer is $X_{M+1}^k$, updating the variables comprises replacing $Y_{N+1}^k$ with the current input sample $X_0^k$ and replacing $X_M^{k-1}$ with the current output sample $Y_0^k$, the next variable of the first variable is $X_M^k$, and the next sample is $X_{-1}^k$.

* * * * *